(12) United States Patent
Shin et al.

(10) Patent No.: US 12,067,258 B2
(45) Date of Patent: Aug. 20, 2024

(54) MEMORY DEVICE AND PROGRAM SPEED CONTROL METHOD THEREOF

(71) Applicant: SK hynix Inc., Icheon-si (KR)

(72) Inventors: Hyun Seob Shin, Icheon-si (KR); Dong Hun Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 87 days.

(21) Appl. No.: 17/962,645

(22) Filed: Oct. 10, 2022

(65) Prior Publication Data

US 2023/0350576 A1 Nov. 2, 2023

(30) Foreign Application Priority Data

Apr. 28, 2022 (KR) .......... 10-2022-0053085

(51) Int. Cl.
*G06F 3/06* (2006.01)

(52) U.S. Cl.
CPC .......... *G06F 3/0619* (2013.01); *G06F 3/0629* (2013.01); *G06F 3/0673* (2013.01)

(58) Field of Classification Search
CPC .... G06F 3/0619; G06F 3/0629; G06F 3/0673; G11C 11/5628; G11C 16/0483; G11C 16/08; G11C 16/10; G11C 16/24; G11C 16/30; G11C 16/32
USPC .......... 365/185.13, 185.18, 189.011, 189.14, 365/189.16; 711/103, 104, 154
See application file for complete search history.

(56) References Cited

U.S. PATENT DOCUMENTS

| | | | | |
|---|---|---|---|---|
| 2008/0239824 | A1* | 10/2008 | Sekar | G11C 16/12 365/185.18 |
| 2011/0080789 | A1* | 4/2011 | Kalavade | G11C 16/12 365/185.03 |
| 2016/0372185 | A1* | 12/2016 | Shim | G11C 16/0483 |
| 2017/0294233 | A1* | 10/2017 | Helm | G11C 16/10 |

FOREIGN PATENT DOCUMENTS

KR 1020170073980 A 6/2017
KR 1020200061253 A 6/2020

* cited by examiner

*Primary Examiner* — Ilwoo Park
(74) *Attorney, Agent, or Firm* — WILLIAM PARK & ASSOCIATES LTD.

(57) ABSTRACT

A memory device includes: a memory cell array including a first memory cell group including memory cells located within a first physical distance from a reference node and a second memory cell group including memory cells located beyond the first physical distance from the reference node; a peripheral circuit configured to perform a program operation of applying program voltages increasing gradually to memory cells included in the memory cell array through word lines; and control logic configured to determine a time at which a first program permission voltage is applied to the first memory cell group and determine a magnitude of the first program permission voltage on the basis of a magnitude of the program voltages in response to a gradual increase in the program voltages, the control logic is further configured to control the peripheral circuit to apply the first program permission voltage to the first memory cell group through bit lines.

23 Claims, 15 Drawing Sheets

MEMORY DEVICE AND PROGRAM SPEED CONTROL METHOD THEREOF

CROSS-REFERENCE TO RELATED APPLICATION

The present application claims priority under 35 U.S.C. § 119(a) to Korean patent application number 10-2022-0053085 filed on Apr. 28, 2022, in the Korean intellectual Property Office, the entire disclosure of which is incorporated by reference herein.

BACKGROUND

1. Technical Field

Various embodiments relate generally to a semiconductor device, and more particularly, to a memory device and a method of controlling its program speed.

2. Related Art

A memory system is a device configured to store data in response to the control of a host device such as a computer or a smartphone. A storage device may include a memory device for storing data and a memory controller for controlling the memory device. Memory devices may be classified as volatile memory devices or non-volatile memory devices.

A volatile memory device may retain data as long as power is being supplied, and may lose the stored data in the absence of supplied power. Volatile memory devices may include Static Random Access Memory (SRAM), Dynamic Random Access Memory (DRAM), and the like.

A non-volatile memory device does not lose data even in the absence of supplied power. Volatile memory devices may include Read Only Memory (ROM), Programmable ROM (PROM), Electrically Programmable ROM (EPROM), Electrically Erasable and Programmable ROM (EEPROM), flash memory, and the like.

SUMMARY

Various embodiments are directed to a memory device maintaining a program speed within a predetermined range regardless of a physical column address of memory cells by controlling a program permission voltage applied to a bit line according to a magnitude of a program voltage, and a method of controlling a program speed thereof.

According to an embodiment of the present disclosure, a memory device may include a memory cell array including a first memory cell group including memory cells located within a first physical distance from a reference node and a second memory cell group including memory cells located beyond the first physical distance from the reference node. The memory device may also include a peripheral circuit configured to perform a program operation of applying program voltages increasing gradually to memory cells included in the memory cell array through word lines. The memory device may further include control logic configured to determine a time at which a first program permission voltage is applied to the first memory cell group and determine a magnitude of the first program permission voltage on the basis of a magnitude of the program voltages in response to a gradual increase in the program voltages, the control logic is further configured to control the peripheral circuit to apply the first program permission voltage to the first memory cell group through bit lines.

According to an embodiment of the present disclosure, a memory device may include a memory cell array including a plurality of memory cell groups, each of the plurality of memory cell groups including a plurality of memory cells having physical column addresses included in a predetermined range. The memory device may also include a peripheral circuit configured to perform a program operation of applying program voltages increasing gradually to the plurality of memory cells included in the memory cell array through word lines. The memory device may further include control logic configured to determine times at which program permission voltages are applied to the plurality of memory cell groups, respectively, and magnitudes of the program permission voltages on the basis of a magnitude of the program voltages in response to a gradual increase in the program voltages, the control logic is further configured to control the peripheral circuit to apply the program permission voltages through bit lines.

According to the present disclosure, a method of operating a memory device may include designating a plurality of memory cell groups including a predetermined number of memory cells having successive physical column addresses. The method may also include applying program voltages increasing gradually to the plurality of memory cell groups through word lines. The method may further include determining application times of program permission voltages applied to the plurality of memory cell groups, respectively, and magnitudes of the program permission voltages on the basis of a magnitude of the program voltages. The method may additionally include applying the program permission voltages to the plurality of memory cell groups through bit lines.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Figure 1:
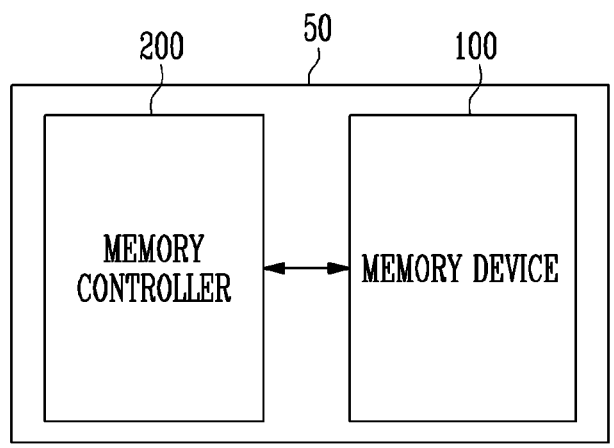
FIG. 1 is a diagram illustrating a memory system including a memory device according to an embodiment of the present disclosure.

FIG. 1 is a diagram illustrating a memory system 50 including a memory device 100 according to an embodiment of the present disclosure.

Referring to FIG. 1, the memory system 50 may include a memory device 100 and a memory controller 200 which controls the operations of the memory device 100. The memory system 50 may be configured to store data in response to the control of a host, Examples of the memory system 50 may include a cellular phone, a smartphone, an MP3 player, a laptop computer, a desktop computer, a game player, a television, a tablet PC, and an in-vehicle infotainment system.

The memory system 50 may be manufactured as one of various types of memory systems according to a host interface corresponding to a communication method with the host. For example, the memory system 50 may be configured as any one of various kinds of storage devices such as a solid state drive (SSD); a multimedia card in the form of an MMC, an eMMC, an RS-MMC and a micro-MMC; a secure digital card in the form of an SD, a mini-SD and a micro-SD; a universal serial bus (USB) storage device; a universal flash storage (UFS) device; a Personal Computer Memory Card International Association (PCMCIA) card type storage device; a peripheral component interconnection (PCI) card type storage device; a PCI express (PCI-E) card type storage device; a compact flash (CF) card; a smart media card; and a memory stick.

The memory system 50 may be manufactured as any one of various types of packages. For example, the memory system 50 may be manufactured as any one of various kinds of package types, such as a package-on-package (POP), a system-in-package (SIP), a system-on-chap (SOC), a multi-chip package (MCP), a chip-on-board (COB), a wafer-level fabricated package (WFP), a wafer-level stack package (WSP), and the like.

The memory device 100 may store data. The memory device 100 may operate in response to the control of the memory controller 200, The memory device 100 may include a memory cell array (not shown) which includes a plurality of memory cells for storing data.

Each of the memory cells may be configured as a Single-Level Cell (SLC) which stores one data bit, a Multi-Level Cell (MLC) which stores two data bits, a Triple-Level Cell (TLC) which stores three data bits, or a Quad-Level Cell (QLC) which stores four data bits.

The memory cell array (not shown) may include a plurality of memory blocks. Each of the memory blocks may include a plurality of memory cells. Each memory block may include a plurality of pages. According to an embodiment, a page may be a unit for storing data in the memory device 100 or reading data stored in the memory device 100. A memory block may be a unit for erasing data.

According to an embodiment, the memory device 100 may include, for example, Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR) SDRAM, Rambus Dynamic Random Access Memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), or spin transfer torque random access memory (STT-RAM). In this specification, by way of example, features and aspects of the present teachings are described in the context in which the memory device 100 uses NAND flash memory.

The memory device 100 may receive a command CMD and an address ADDR from the memory controller 200. The memory device 100 may be configured to access an area selected in response to the received address ADDR in the memory cell array. The memory device 100 may perform an operation corresponding to the received command CMD on the area selected by the address ADDR, For example, the memory device 100 may perform a program operation, a read operation, and an erase operation. During a program operation, the memory device 100 may store data in the area selected by the address ADDR. During a read operation, the memory device 100 may read the data from the area selected by the address ADDR. During an erase operation, the memory device 100 may erase the data stored in the area selected by the address ADDR.

The memory device 100 may include a plurality of planes. A plane may refer to a unit in which an operation is performed independently. For example, the memory device 100 may include two, four, or eight planes. A plurality of planes may independently perform a program operation, a read operation, or an erase operation at the same time.

The memory device 100 may include a sequential area. The sequential area may refer to an area with successive logical block addresses LBA. The memory controller 200 may perform a write operation to store data in the sequential area. The successive logical block addresses LBA may be stored in the sequential area. The memory device 100 may include a plurality of sequential areas having different sizes. The memory device 100 may be divided into units of the sequential area.

According to an embodiment, the memory device 100 may perform a background media scan (BGMS) operation. The background media scan (BGMS) operation may be performed during an idle time when a command is not received from the memory controller 200. In addition, the background media scan (BGMS) operation may be performed to prevent a read fail, i.e., uncorrectable error correction codes (UECC) from occurring in data which is read during a read operation.

For example, the memory device 100 may scan (read) data stored in the memory cells during idle time. The memory device 100 may select a page where a read fail is likely to occur on the basis of a scan result, and may perform a refresh operation. The memory device 100 may scan data by memory block numbers ire sequential or random order.

The memory device 100 may detect a page where uncorrectable error correction codes (UECC) potentially occur by scanning data stored in the page during the background media scan (BGMS) operation. The memory device 100 may prevent uncorrectable error correction codes (UECC) by programming another memory block with the data of the detected page. The memory device 100 may improve data reliability by detecting a page where uncorrectable error correction codes (UECC) potentially occur due to read disturbance and retention.

The memory controller 200 may control the general operation of the memory system 50.

When power is applied to the memory system 50, the memory controller 200 may execute firmware (FW). When the memory device 100 is a flash memory device, the firmware FW may include a host interface layer HIL that controls communication with the host, and the memory controller 200 may include a flash translation layer FTL that controls communication between the host and the memory device 100 and a flash interface layer FIL that controls communication with the memory device 100.

The memory controller 200 may receive write data and a logical block address (LBA) from the host, and may translate the logical block address (LBA) into a physical block address (PBA) that indicates an address of memory cells in which data included in the memory device 100 is to be stored. In the specification, the logical block address (LBA) may have the same meaning as a "logical address" or a "logic address." In the specification, the physical block address (PBA) may have the same meaning as a "physical address."

The memory controller 200 may control the memory device 100 to perform a program operation, a read operation, or an erase operation in response to a request from the host. During a program operation, the memory controller 200 may provide a program command, the physical block address (PBA), and data to the memory device 100. During a read operation, the memory controller 200 may provide a read command and the physical block address (PBA) to the memory device 100. During an erase operation, the memory controller 200 may provide an erase command and the physical block address (PBA) to the memory device 100.

According to an embodiment, the memory controller 200 may generate and transfer a command, an address, and data to the memory device 100 regardless of a request from the host. For example, the memory controller 200 may provide the memory device 100 with commands, addresses, and data for performing a read operation and write operations involved in carrying out wear leveling, read reclaim, and garbage collection.

In an embodiment, the memory controller 200 may control at least two memory devices 100. The memory controller 200 may control the memory devices 100 according to an interleaving scheme to improve operational performance. According to the above-described interleaving scheme, operations on at least two memory devices 100 may be controlled to overlap each other. However, the interleaving scheme may cause at least two memory devices 100 to operate in parallel.

A buffer memory device (not shown) may temporarily store data provided from the host, i.e., data to be stored in the memory device 100, or may temporarily store data read from the memory device 100. According to an embodiment, the buffer memory device (not shown) may be a volatile memory device. For example, the buffer memory device (not shown) may utilize Dynamic Random Access Memory (DRAM) or Static Random Access Memory (SRAM).

The host may communicate with the memory system 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
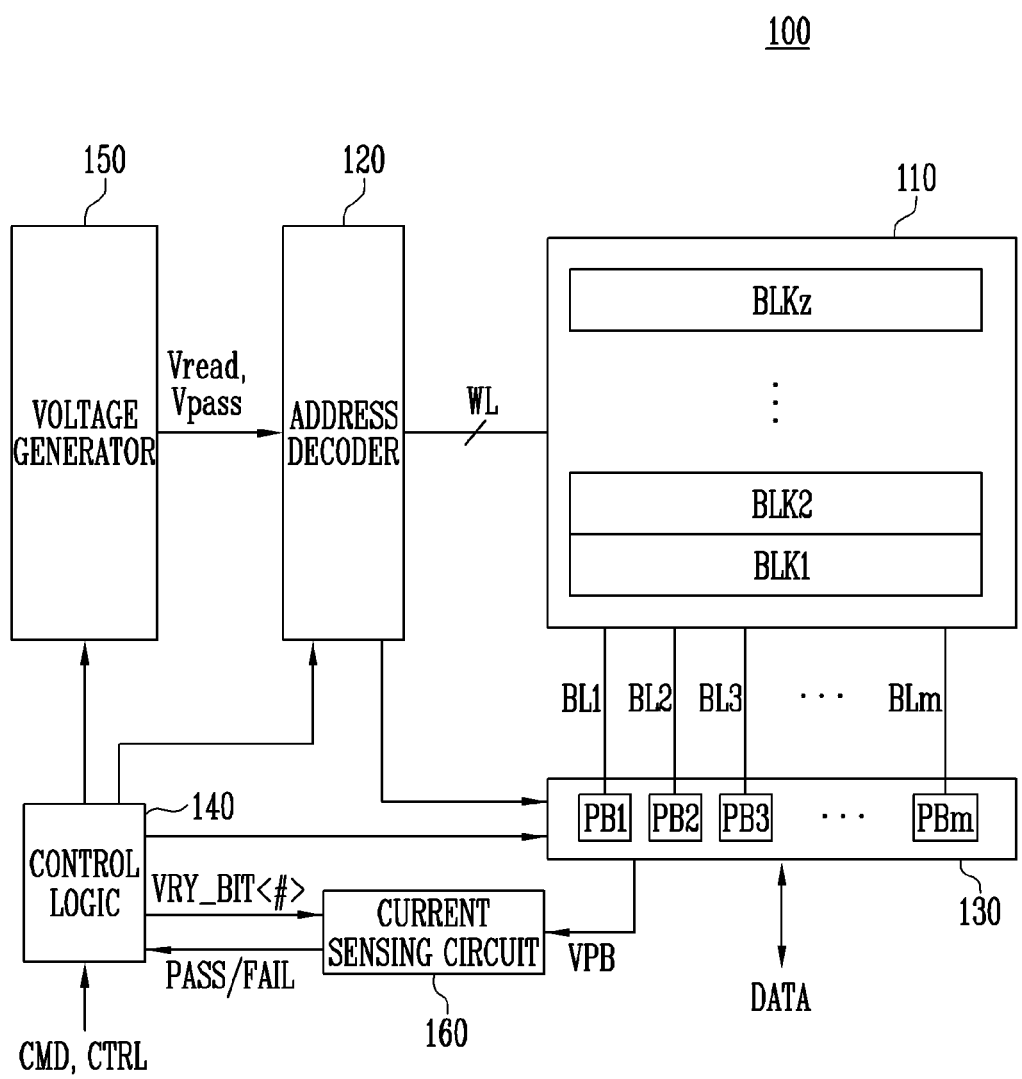
FIG. 2 is a diagram illustrating the memory device shown in FIG.

FIG. 2 is a diagram illustrating the memory device 100 of FIG. 1 in more detail.

Referring to FIG. 2, the memory device 100 may include a memory cell array 110, an address decoder 120, a read and write circuit 130, control logic 140, a voltage generator 150, and a current sensing circuit 160. The address decoder 120, the read and write circuit 130, the voltage generator 150 and the current sensing circuit 160 may be collectively referred to as a peripheral circuit which is controlled by the control logic 140.

The memory cell array 110 may include a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read and write circuit 130 through bit lines BL1 to BLm. Each of the plurality of memory blocks BLK1 to BLKz may include a plurality of memory cells. According to an embodiment, the plurality of memory cells may be non-volatile memory cells which have a vertical channel structure. The memory cell array 110 may have a two-dimensional structure. According to an embodiment, the memory cell array 110 may have a three-dimensional structure, Each of the plurality of memory cells included in the memory cell array may store data of at least one bit. According to an embodiment, each of the plurality of memory cells included in the memory cell array 110 may be a single-level cell (SLC) which stores 1-bit data. According to another embodiment, each of the plurality of memory cells included in the memory cell array 110 may be a multi-level cell (MLC) which stores 2-bit data. According to another embodiment, each of the plurality of memory cells included in the memory cell array 110 may be a triple-level cell (TLC) which stores 3-bit data, According to another embodiment, each of the plurality of memory cells included in the memory cell array 110 may be a quad-level cell (QLC) which stores 4-bit data. According to an embodiment, each of the plurality of memory cells included in the memory cell array 110 may store five or more bits of data.

The address decoder 120 may be coupled to the memory cell array 110 through the word lines WL. The address decoder 120 may be configured to operate in response to the control of the control logic 140. The address decoder 120 may receive an address through an input/output buffer in the memory device 100.

The address decoder 120 may be configured to decode a block address of the received address. The address decoder 120 may select at least one memory block according to the decoded block address. In addition, the address decoder 120 may apply a read voltage Vread generated by the voltage generator 150 to a selected word line in a selected memory block and may apply a pass voltage Vpass to unselected word lines during a read voltage application of a read operation. In addition, during a program verify operation, the address decoder 120 may apply a verify voltage generated by the voltage generator 150 to the selected word line of the selected memory block, and may apply the pass voltage Vpass to unselected word lines.

The address decoder 120 may be configured to decode a column address of the received address. The address decoder 120 may transfer the decoded column address to the read and write circuit 130.

A read operation and a program operation of the memory device 100 may be performed in units of pages. An address which is received at the request of a read operation and a program operation may include a block address, a row address, and a column address. The address decoder 120 may select one memory block and one word line in response to the block address and the row address. The column address may be decoded by the address decoder 120 and provided to the read and write circuit 130, In the present disclosure, memory cells coupled to one word line may be referred to as a "physical page."

The read and write circuit 130 may include a plurality of page buffers PB1 to PBm. The read and write circuit 130 may operate as a read circuit during a read operation of the memory cell array 110 and a write circuit during a write operation thereof. The page buffers PB1 to PBm may be coupled to the memory cell array 110 through the bit lines BL1 to BLm. The page buffers PB1 to PBm may continuously supply a sensing current to bit lines coupled to memory cells in order to sense threshold voltages of the memory cells and sense changes in the amount of current caused by program states of the memory cells corresponding thereto through a sensing node to latch sensing data during a read operation and a program verify operation. The read and write circuit 130 may operate in response to page buffer control signals output from the control logic 140. In the specification, a write operation of the write circuit may refer to a program operation with respect to selected memory cells.

The read and write circuit 130 may sense data of a memory cell, temporarily store the read data, and output data DATA to the input/output buffer (not illustrated) of the semiconductor memory device 100 during a read operation. According to an embodiment, the read and write circuit 130 may include a column selector in addition to the page buffers (or page registers), According to an embodiment of the present disclosure, the read and write circuit 130 may be a page buffer.

The control logic 140 may be implemented as hardware, software, or a combination of hardware and software. For example, the control logic 140 may be a control logic circuit operating in accordance with an algorithm and/or a processor executing control logic code. The control logic 140 may be coupled to the address decoder 120, the read and write circuit 130, the voltage generator 150, and the current sensing circuit 160. The control logic 140 may receive a command CMD and a control signal CTRL through the input/output buffer (not illustrated) of the memory device 100. The control logic 140 may be configured to control the general operations of the memory device 100 in response to the control signal CTRL, In addition, the control logic 140 may output a control signal to control sensing node precharge potential levels of the plurality of page buffers PB1 to PBm. The control logic 140 may control the read and write circuit 130 to perform a read operation of the memory cell array 110.

The control logic 140 may determine whether a verify operation with respect to a predetermined target program state has passed or failed in response to a pass signal PASS or a fail signal FAIL which is received from the current sensing circuit 160.

The voltage generator 150 may generate the read voltage Vread and the pass voltage Vpass in response to a control signal which is output from the control logic 140 during a read operation. To generate a plurality of voltages having various voltage levels, the voltage generator 150 may include a plurality of pumping capacitors which receive an internal power voltage. The voltage generator 150 may generate a plurality of voltages by selectively activating the plurality of pumping capacitors in response to the control of the control logic 140.

The current sensing circuit 160 may generate a reference current and a reference voltage in response to an allowable bit VRY_BIT<#> which is received from the control logic 140 during a verify operation. The current sensing circuit 160 may compare the generated reference voltage with a sensing voltage VPB received from the page buffers PB1 to PBm included in the read and write circuit 130, or may compare the generated reference current with a sensing current received from the page buffers PB1 to PBm included in the read and write circuit 130 to thereby output the pass signal PASS or the fail signal FAIL.

The address decoder 120, the read and write circuit 130, the voltage generator 150, and the current sensing circuit 160 may function as a 'peripheral circuit' which is configured to perform a read operation, a write operation, and an erase operation on the memory cell array 110. The control logic 140 peripheral circuit may perform a read operation, a write operation, and an erase operation on the memory cell array 110 in response to the control of the control logic 140.

Figure 3:
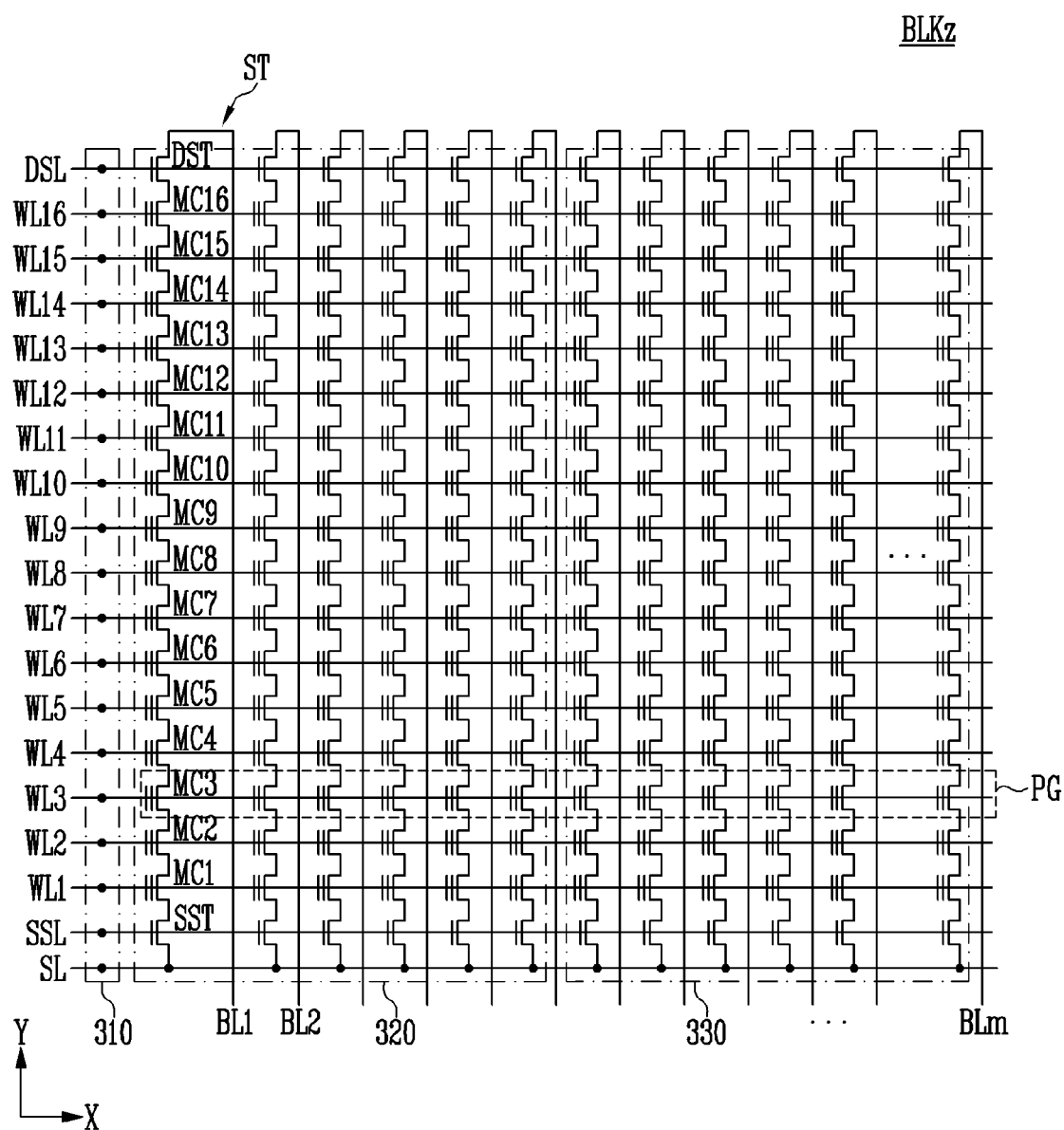
FIG. 3 is a diagram illustrating the structure of a memory block among a plurality of memory blocks of FIG. 2.

FIG. 3 is a diagram illustrating the structure of a memory block BLKz among the memory blocks BLK1 to BLKz as shown in FIG. 2.

As shown in FIG. 3, the memory block BLKz may be one of the memory blocks BLK1 to BLKz as shown in FIG. 2.

Referring to FIG. 3, a plurality of word lines which are arranged in parallel with each other may be coupled to a first select line and a second select line. The first select line may be a source select line SSL and the second select line may be a drain select line DSL. More specifically, the memory block BLKz may include a plurality of strings ST that are coupled between the bit lines BL1 to BLm and a source line SL. The bit lines BL1 to BLm may be coupled to the strings ST, respectively, and the source line SL may be commonly coupled to the strings ST. The strings ST may have the same configuration. Thus, the string ST coupled to the first bit line BL1 will be described in detail as an example.

The string ST may include a source select transistor SST, a plurality of memory cells MC1 to MC16, and a drain select transistor DST which are coupled in series to each other between the source line SL and the first bit line BL1. Each string ST may include at least one source select transistor SST, at least one drain select transistor DST, and might include more memory cells than the memory cells MC1 to MC16 shown in FIG. 3.

A source of the source select transistor SST may be coupled to the source line SL and a drain of the drain select transistor DST may be coupled to the first bit line BL1. The memory cells MC1 to MC16 may be coupled in series between the source select transistor SST and the drain select transistor DST, Gates of the source select transistors SST included in different strings ST may be coupled to the source select line SSL, gates of the drain select transistors DST may be coupled to the drain select line DSL, and gates of the memory cells MC1 to MC16 may be coupled to a plurality of word lines WL1 to WL16, respectively. A group of memory cells coupled to the same word line, among the memory cells included in the different strings ST, may be referred to as a physical page PG, Therefore, the memory block BLKz may include as many physical pages PG as the number of word lines WL1 to WL16.

A single memory cell may store one bit of data. This memory cell is generally called a single-level cell (SLC). One physical page PG may store one logical page (LPG) data. One LPG data may include as many data bits as the number of cells included in one physical page PG.

However, one memory cell may store two or more bits of data. Thus, one physical page PG may store data corresponding to two or more logical pages LPG.

Memory cells may be included in a plurality of memory cell groups. The memory cells may be Included in different memory cell groups depending on the distances between the memory cells and a reference node 310, respectively. The reference node 310 may be set by each word line. According to an embodiment of the present disclosure, the distance between the reference node 310 and a memory cell may refer to a distance between the reference node and the memory cells which are located on the same word line.

As shown in FIG. 3, each of the memory cells may be included in a near cell group 320 when the distance between each memory cell and the reference node 310 is less than a predetermined value, or in a far cell group 330 where the distance between each memory cell and the reference node 310 is greater than or equal to the predetermined value.

A program speed of the memory cells included in the near cell group 320 may be faster than that of the memory cells included in the far cell group 330. Although only two memory cell groups i.e., the near and far cell groups 320 and 330 are shown in FIG. 3 by way of example, there may be more than two memory cell groups including memory cells according to the program speed of the memory cells.

Figure 4:
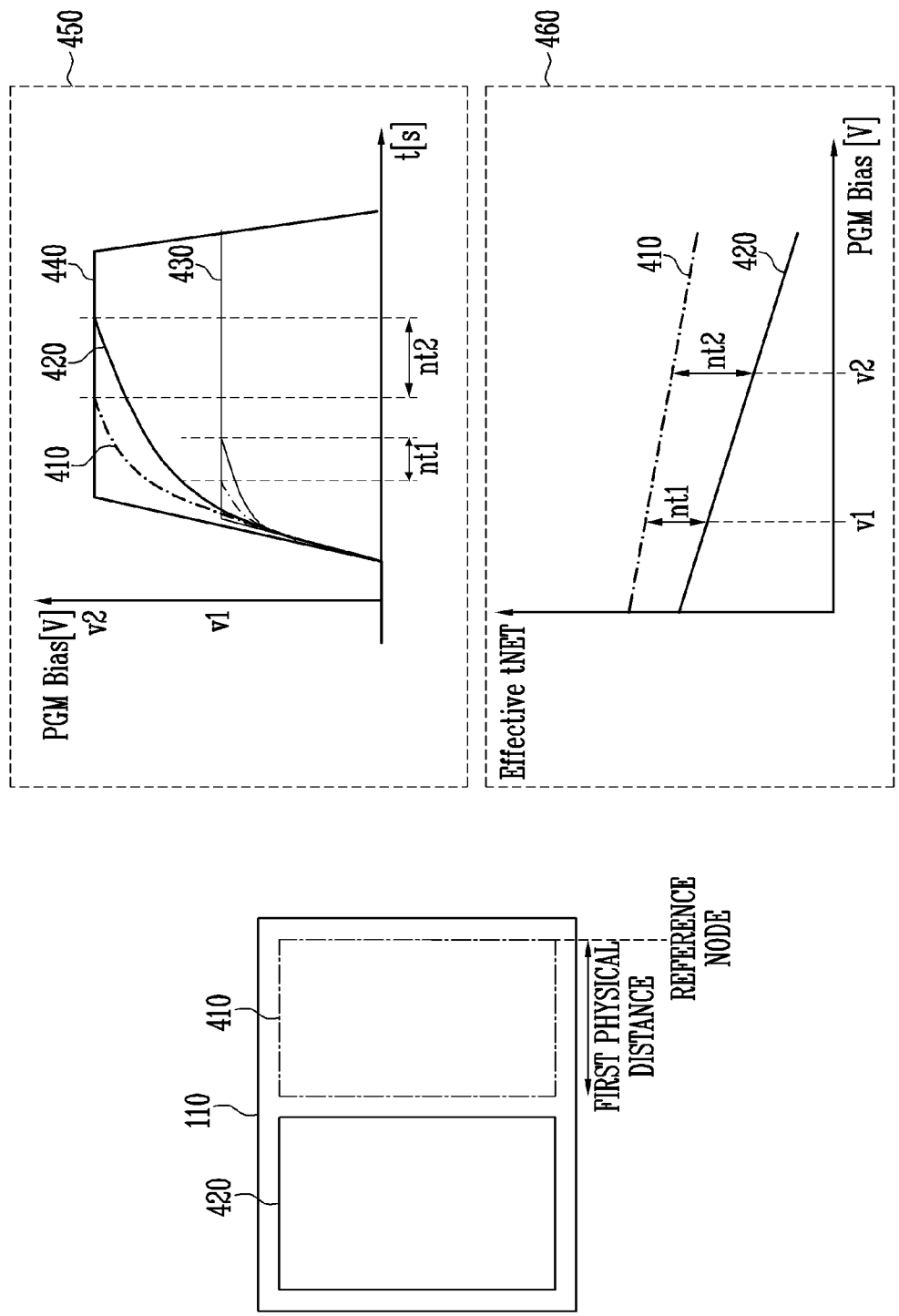
FIG. 4 is a diagram illustrating memory cells having a program speed varying depending on a physical distance.

FIG. 4 is a diagram illustrating memory cells having different program speeds depending on physical distances.

Referring to FIG. 4, the memory cells included in the memory cell array 110 may have different physical distances from a reference node. According to an embodiment, a physical distance may be a physical column address of a memory cell. The memory cells included in the memory cell array 110 may be included in a first memory cell group 410 and a second memory cell group 420 according to physical distances between the memory cells and the reference node.

Memory cells which are located within a first physical distance from the reference node may be included in the first memory cell group 410. Memory cells which are located away from the reference node beyond the first physical distance may be included in the second memory cell group 420. According to an embodiment, memory cell groups may be divided according to a program speed. According to an embodiment, the first memory cell group 410 may correspond to the near cell group 320 as shown in FIG. 3. The second memory cell group 420 may correspond to the far cell group 330 as shown in FIG. 3.

A program speed of memory cells close to the reference node may be faster than that of memory cells far away from the reference node. As the program speed of the memory cells increases, the memory cells may have higher threshold voltages.

A voltage which is applied to the memory cells close to the reference node through a word line may reach a program voltage faster than the memory cells away from the reference node. The time at which the voltage applied through the word line reaches the program voltage may vary depending on the distance between the memory cells and the reference node. As a memory cell is closer to the reference node, a voltage applied to the memory cell may reach the program voltage faster.

A first graph 450 of FIG. 4 may show a program voltage over time. In the first graph 450, the x-axis may represent time and the y-axis may represent a program voltage. A voltage which is applied to a gate of a memory cell may reach the program voltage after a predetermined time has passed because the voltage was applied.

A difference in program speed may occur according to the physical distances or the physical column addresses of the memory cells. As the magnitude of the program voltage increases, the difference in program speed may increase. A voltage which is applied to the memory cells included in the first memory cell group 410 may reach the program voltage faster than a voltage which is applied to the memory cells included in the second memory cell group 420.

A first program voltage 430 may be applied to memory cells. The voltage applied to the memory cells included in the first memory cell group 410 may reach the first program voltage 430 before the second memory cell group 420. A difference between the time at which the voltage applied to the first memory cell group 410 reaches the first program voltage 430 and the time at which the voltage applied to the second memory cell group 420 reaches the first program voltage 430 may be a first difference nt1.

The difference in program speed between the first memory cell group 410 and the second memory cell group 420 may vary depending on the magnitude of the program voltage. More specifically, as the magnitude of the program voltage increases, the difference in program speed may increase.

A program voltage may increase in response to an increase in program loops. The program voltage may be a step voltage which increases gradually. A second program voltage 440 may be applied to memory cells. In the same manner, a voltage applied to the memory cells included in the first memory cell group 410 may reach the second program voltage 440 before the second memory cell group 420, A difference between the time at which the voltage applied to the first memory cell group 410 reaches the second program voltage 440 and the time at which the voltage applied to the second memory cell group 420 reaches the second program voltage 440 may be a second difference nt2.

As the magnitude of the program voltage increases, a difference in time at which a voltage applied to a bit line reaches the program voltage ay increase. For example, the second program voltage 440 may be greater than the first program voltage 430 and the second difference nt2 may be greater than the first difference nt1. As the magnitude of the program voltage increases, a difference in time at which a voltage applied to memory cells coupled to the same word line reaches the program voltage may increase.

As the magnitude of the program voltage increases, a difference in program speed between the memory cell groups may increase. A second graph 460 of FIG. 4 may show a difference in program speed between the first memory cell group 410 and the second memory cell group 420. In the second graph 460, the x-axis may represent a program voltage and the y-axis may represent an effective application time of the program voltage. The effective application time of the program voltage may be changed by a difference between the program voltage applied to the gate of the memory cell and the program permission voltage applied through the bit line.

As the program voltage increases, the program speed of the memory cells may decrease. The program speed may be proportional to the effective application time of the program voltage. As the magnitude of the program voltage increases, the effective application time of the program voltage may decrease.

The first program voltage 430 may have a voltage magnitude of v1 and the second program voltage 440 may have a voltage magnitude of v2. Because v1 is smaller than v2, the second difference nt2 of the second memory cell group 420 may be greater than the first difference nt1 of the first memory cell group 410.

A decrease rate of the effective application time of the program voltage of the first memory cell group 410 may be smaller than a decrease rate of the effective application time of the program voltage of the second memory cell group 420. As the magnitude of the program voltage increases, the difference in the effective application time of the program voltage between the first memory cell group 410 and the second memory cell group 420 may increase. As the magnitude of the program voltage increases, a difference in program speed between memory cells applied to the same word line may increase.

As shown in FIG. 4, although only the two memory cell groups are illustrated, the number of memory cell groups might not be limited thereto. According to an embodiment, the memory cells included in the memory cell array 110 may be included in a plurality of memory cell groups according to the physical distances or the physical column addresses thereof. The memory cells included in the memory cell group may have a total capacity of 1 KB to 2 KB. According to an embodiment, a plurality of memory cell groups may be near cell groups, Other memory cell groups may be far cell groups.

Figure 5:
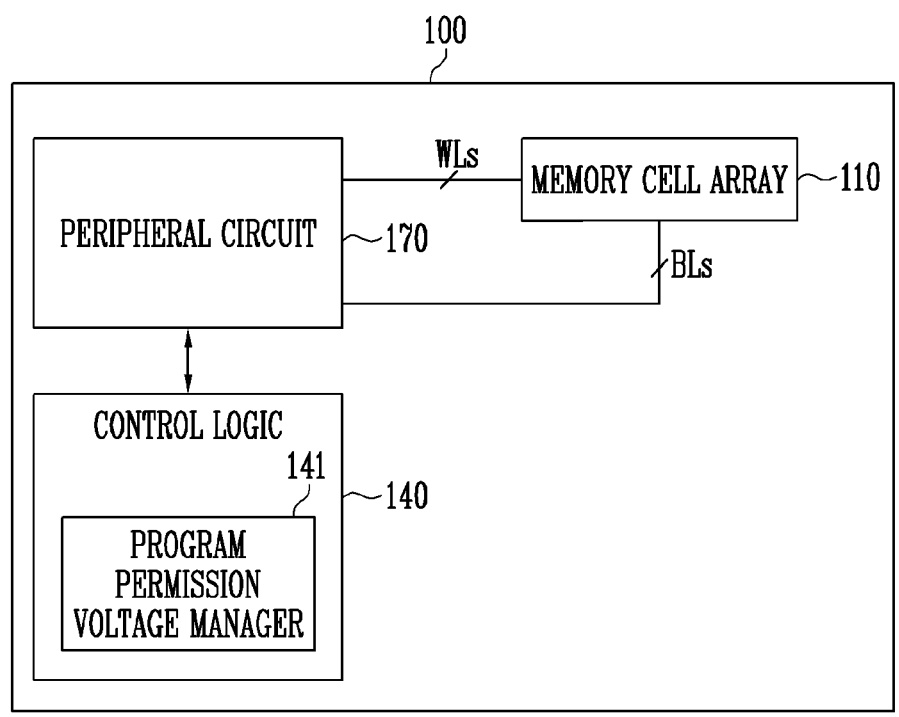
FIG. 5 is a block diagram illustrating a memory device with a constant program speed.

FIG. 5 is a block diagram illustrating the memory device 100 with a constant program speed according to an embodiment of the present disclosure.

Referring to FIG. 5, the memory device 100 may include the memory cell array 110, the control logic 140, and a peripheral circuit 170, The peripheral circuit 170 may apply a program voltage to gates of memory cells through word lines. The peripheral circuit 170 may control a program speed by applying a program permission voltage through bit lines.

The memory cell array 110 may include a first memory cell group that includes memory cells located within a first physical distance from a reference node and a second memory cell group that includes memory cells farther away from the reference node beyond the first physical distance. According to another embodiment, the memory cell array 110 may include a plurality of memory cell groups which include memory cells with physical column addresses included in a predetermined range. According to another embodiment, the memory cell array 110 may include a plurality of memory cell groups corresponding to a predetermined capacity.

The peripheral circuit 170 may perform a program operation to apply program voltages, which increase gradually, to the memory cells included in the memory cell array 110 through the word lines. The peripheral circuit 170 may apply a program permission voltage to the memory cell groups included in the memory cell array 110. The peripheral circuit 170 may apply the program voltages through the bit lines which increase gradually in response to an increase in program loops included in a program operation.

When the program permission voltage is applied to the memory cell group through the bit lines, the program speed of the memory cells included in the memory cell group may be decreased. By applying the program permission voltage, a difference in program speed between a cell group which is close to a reference node and a cell group which is far away from the reference node may be decreased. A program speed of memory cells coupled to the same word line may be decreased away from the reference node. The distance from the reference node may correspond to a physical column address of the memory cell.

The control logic 140 may determine a time at which a first program permission voltage is applied to the first memory cell group and the magnitude of the first program voltage on the basis of the magnitude of the program voltages corresponding to the gradual increase thereof. The control logic 140 may control the peripheral circuit 170 to apply the first program permission voltage to the first memory cell group through the bit lines.

A program permission voltage manager 141 may determine a time at which the first program permission voltage is applied first and a magnitude of the first program permission voltage applied first, based on the first physical distance. The program permission voltage manager 141 may change the application time and the magnitude of the first program permission voltage on the basis of the magnitude of the program voltages.

The program permission voltage manager 141 may determine a program permission voltage to be applied based on the distance from the reference node to each of the memory cells included in the first memory cell group. As the distance between the reference node and the memory cells decreases, the magnitude of the program permission voltage may increase.

The program permission voltage manager 141 may determine as an application time of a program permission voltage, a time which is earlier than a time of completion of the application of the program voltage by a time corresponding to the first physical distance. The time at which the first program permission voltage is applied first may be determined by the first physical distance.

The program permission voltage manager 141 may control the peripheral circuit 170 to apply the first program permission voltage earlier as the magnitude of the program voltages increases. The program permission voltage manager 141 may control the peripheral circuit 170 to advance the application time of the first program permission voltage at a regular interval in response to the gradual increase of the program voltages.

According to an embodiment, the program permission voltage manager 141 may control the peripheral circuit 170 to increase the magnitude of the first program voltage as the magnitude of the program voltages increases. The program permission voltage manager 141 may control the peripheral circuit 170 to gradually increase the magnitude of the first program permission voltage in response to the gradual increase of the program voltages.

According to an embodiment, the program voltages applied through the word lines may be high voltages or low voltages depending on the memory cells to which the program voltages are applied, A program voltage corresponding to a high voltage may have a greater magnitude than a program voltage corresponding to a low voltage. Because the program voltage corresponding to the high voltage has a greater magnitude, a time of applying a program permission voltage may be advanced, or the magnitude of the program permission voltage may be increased. The program permission voltage manager 141 may additionally change the application time of the first program permission voltage or the magnitude thereof in response to the program voltage applied through the word line when the program voltage is the high voltage.

When the program permission voltage is applied to the memory cells through the bit lines, the difference in program speed between the memory cells coupled to the same word line may be reduced. The peripheral circuit 170 may apply the program permission voltage determined by the program permission voltage manager 141 to the memory cells. According to an embodiment, in response to the application of the program permission voltage, a difference in effective application time of a program voltage applied to memory cells coupled to the same word line, among the memory cells included in the first and second memory cell groups, may be smaller than a predetermined reference value. The effective application time of the program voltage may be determined by the program voltage applied to the memory cells through the word lines and the program permission voltage applied through bit lines. When the effective application time of the program voltage is less than the predetermined value, the memory cells included in the first memory cell group and the second memory cell group may have the same program speed.

According to an embodiment, the control logic 140 may control the peripheral circuit 170 to apply a second program permission voltage to the second memory cell group through the bit lines. The program permission voltage manager 141 may control the peripheral circuit 170 so that the first program permission voltage may be applied earlier than the second program permission voltage. According to another embodiment, the program permission voltage manager 141 may control the peripheral circuit 170 so that the first program permission voltage may have a greater magnitude than the second program permission voltage.

According to an embodiment, the magnitude and the application time of a program permission voltage may vary depending on a distance from a reference node, a magnitude of program voltages which increase gradually, or whether the program voltages are high voltages or not. The magnitude of the program voltage may increase as a program operation proceeds. The magnitude of the program permission voltage may be increased, or the program permission voltage may be applied earlier in response to the increase in magnitude of the program voltage.

According to another embodiment, a plurality of memory cell groups included in the memory cell array 110 may include memory cells having physical column addresses included in a predetermined range. The control logic 140 may determine application times of program permission voltages applied to a plurality of memory cell groups and magnitudes of the program permission voltages on the basis of the magnitude of program voltages in response to the gradual increase of the program voltages. The control logic 140 may control the peripheral circuit 170 to apply the program permission voltages through the bit lines.

The program permission voltage manager 141 may determine times at which the program permission voltages are applied first and magnitudes of the program permission voltages applied first on the basis of physical column address ranges corresponding to the plurality of memory cells, respectively. The program permission voltage manager 141 may change the application times and the magnitudes of the program permission voltages on the basis of the magnitudes of the program voltages. The program permission voltage manager 141 may additionally change the application times and the magnitudes of the program permission voltages in response to the program voltage applied through the word line when the program voltage is a high voltage.

The program permission voltage manager 141 may determine times at which the program permission voltages are applied by reflecting an increase in program voltages from the times at which the program voltages are completely applied. The program permission voltage manager 141 may control the peripheral circuit 170 to apply the program permission voltages earlier in response to the increase of the program voltages. The program permission voltage manager 141 may control the peripheral circuit 170 to increase the respective magnitudes of the program permission voltages in response to the increase of the program voltages.

According to an embodiment of the present disclosure, at least one of an application time of a program permission voltage and a magnitude of the program permission voltage may be changed in response to an increase of a program voltage. In other words, when the magnitude of the program voltage increases, the application time of the program permission voltage may be advanced, or the magnitude of the program permission voltage may be increased. In addition, when the magnitude of the program voltage increases, the time of applying the program permission voltage may be advanced and the magnitude of the program permission voltage may be increased.

Figure 6:
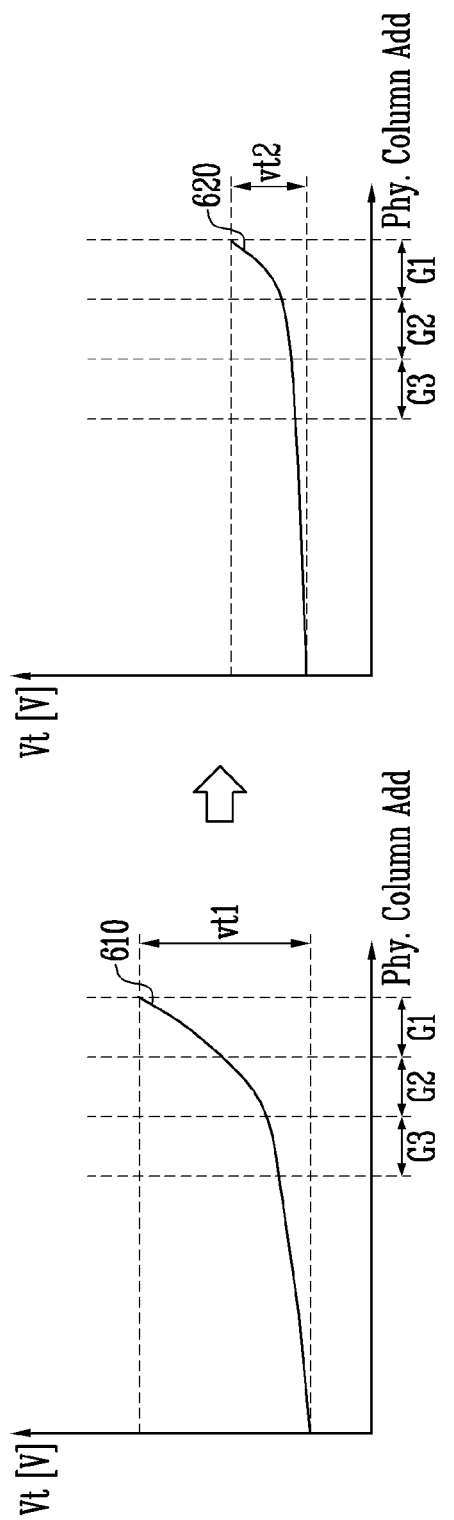
FIG. 6 is a diagram illustrating a method of controlling a program speed by changing a magnitude of a program permission voltage according to an embodiment of the present disclosure.

FIG. 6 is a diagram illustrating a method of controlling a program speed by changing a magnitude of a program permission voltage according to an embodiment of the present disclosure.

Referring to FIG. 6, threshold voltages (610 and 620) of memory cells to be programmed may vary depending on the physical column addresses of the memory cells. As the physical column addresses of the memory cells increase, the memory cells may be closer to a reference node.

Memory cells coupled to the same word line to which a program voltage is applied may have different threshold voltages. A program speed of memory cells close to the reference node may be faster than that of memory cells far away from the reference node. The memory cells having a faster program speed may have a greater threshold voltage than the memory cells having a slower program speed.

Because the memory cells coupled to the same word lime have different program speeds, the memory cells may have different threshold voltages (610), When a program permission voltage is not applied through a bit line, there may be a voltage difference vt1 between the memory cells coupled to the same word line due to a difference in program speed between the memory cells.

The program permission voltage may be applied to the bit line of the memory cells. The program permission voltage manager may determine a time at which the program permission voltage is applied, or a magnitude of the program permission voltage on the basis of the magnitude of the program voltage. A greater program permission voltage may be applied to the memory cells with the faster program speed.

In FIG. 6, a program permission voltage may be applied to memory cell groups G1, G2, and G3. When the program permission voltage is applied through bit lines, the difference in threshold voltage (620) between the memory cells coupled to the same word line may be reduced. When the program permission voltage is applied through the bit lines, the difference in program speed between the memory cells coupled to the same word line may be reduced, Because the difference in program speed is reduced, there may be a difference vt2 in threshold voltage between the memory cells coupled to the same word line.

According to an embodiment, the program permission voltage applied to the memory cell group G1 may be greater than the program permission voltage applied to the memory cell group G2, In the same manner, the program permission voltage applied to the memory cell group G2 may be greater than the program permission voltage applied to the memory cell group G3. The program permission voltage of the memory cell group G1 may have the largest magnitude.

According to another embodiment, the program permission voltage applied to the memory cell group G1 may be applied earlier than the program permission voltage applied to the memory cell group G2. The program permission voltage applied to the memory cell group G2 may be earlier than the program permission voltage applied to the memory cell group G3. The program permission voltage may be applied to the memory cell group G1 earliest among the first to third memory cell groups G1 to G3.

The program permission voltages with different magnitudes may be applied to the first, second, and third memory cell groups G1, G2, and G3 at different times. The program speeds of the first, second, and third memory cell groups G1, G2, and G3 to which the program permission voltages are applied may be reduced, A threshold voltage difference between the memory cells coupled to the same word line may be reduced in response to the decrease in the program speed.

According to an embodiment, each of the first, second, and third memory cell groups G1, G2, and G3 may have a capacity of 1 KB to 2 KB. The first, second, and third memory cell groups G1, G2, and G3 may have the same capacity. Memory cells included in the first, second, and third memory cell groups G1, G2, and G3 may have successive physical column addresses. The first, second, and third memory cell groups G1, G2, and G3 may be banks of the memory device.

Although FIG. 6 illustrates the three memory cell groups, the present disclosure is not limited thereto, There may be various numbers of memory cell groups. As the number of memory cell groups increases, a program speed difference between the memory cells coupled to the same word line may be reduced.

Figure 7:
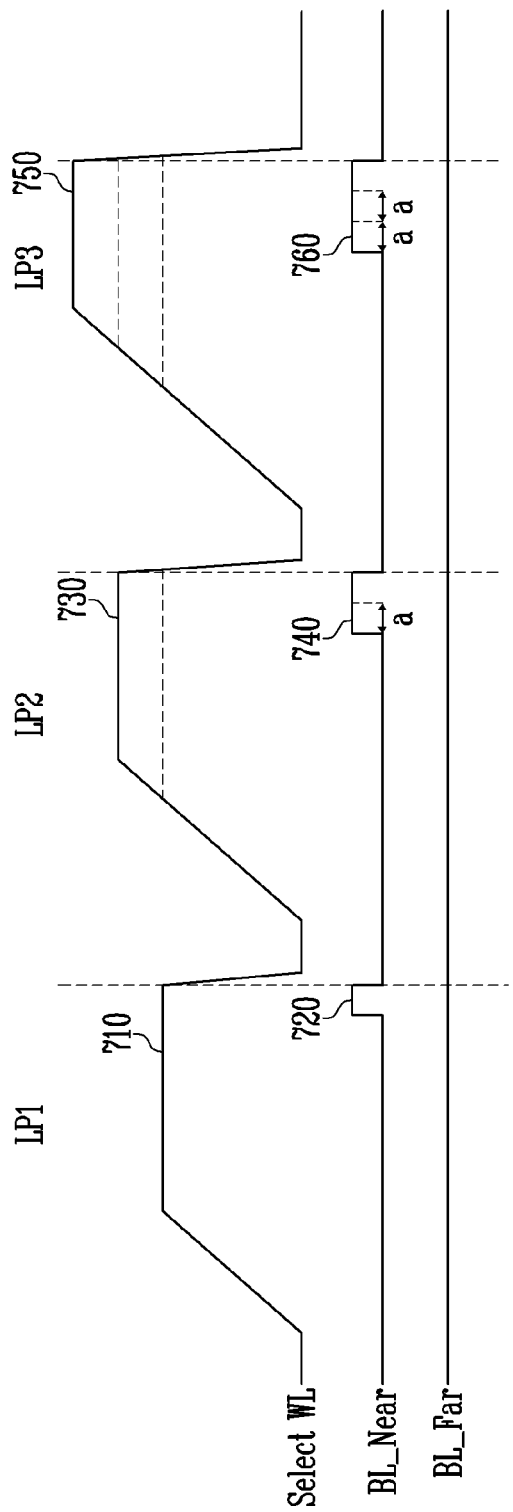
FIG. 7 is a diagram illustrating a method of changing a time at which a program permission voltage is applied according to teachings of the present disclosure.

FIG. 7 is a diagram illustrating a method of changing a time at which a program permission voltage is applied according to an embodiment of the present disclosure.

Referring to FIG. 7, program permission voltages may be applied to a memory cell group which is close to a reference node in response to program voltages applied to a plurality of program loops LP1, PL2, and LP3. The program permission voltages may be applied to memory cells through bit lines. A time at which the program permission voltage is applied may vary depending on the magnitude of the program voltage.

When the first program loop LP1 proceeds, a first program voltage 710 may be applied. When the first program voltage 710 is applied, a first program permission voltage 720 may be applied to the memory cell group which is close to the reference node through the bit lines. The first program permission voltage 720 may be applied earlier by a time determined by the program permission voltage manager than the completion time of the application of the first program voltage 710. According to an embodiment, a time at which the first program permission voltage 720 corresponding to the first program voltage 710 is applied may be determined by a physical distance between the reference node and the memory cell group to which the first program permission voltage 720 is applied, or a physical column address.

When the second program loop LP2 proceeds, a second program voltage 730 may be applied. When the second program voltage 730 is applied, a second program permission voltage 740 may be applied to a memory cell group which is close to the reference node through the bit lines. The second program permission voltage 740 may be applied earlier by a time determined by the program permission voltage manager than the completion time of the application of the second program voltage 730. The second program permission voltage 740 may be applied earlier than the first program permission voltage 720 by 'a'. Because the magnitude of the second program voltage 730 applied in the second program loop LP2 is greater than the first program voltage 710 applied in the first program loop LP1, the second program permission voltage 740 may be applied earlier than the first program permission voltage 720 by 'a'.

When the third program loop LP3 proceeds, a third program voltage 750 may be applied. In response to the application of the third program voltage 750, a third program permission voltage 760 may be applied to a memory cell group which is close to the reference node through the bit lines. The third program permission voltage 760 may be applied earlier by a time determined by the program permission voltage manager from the completion time of the application of the third program voltage 750. The third program permission voltage 760 may be applied earlier than the second program permission voltage 740 by 'a'. Because the magnitude of the third program voltage 750 applied in the third program loop LP3 is greater than the second program voltage 730 applied in the second program loop LP2, the third program permission voltage 760 may be applied earlier than the second program permission voltage 740 by 'a', The third program permission voltage 760 may be applied earlier than the first program permission voltage 720 by '2a'.

According to an embodiment, because the magnitude of the program voltages 710, 730, and 750 increases gradually, the program permission voltages 720, 740, and 760 may be applied earlier gradually by 'a'. When the program permission voltages 720, 740, and 760 are applied, the program speed of the memory cells may be reduced. The difference between the threshold voltages of the memory cells coupled to the same word line may be reduced.

Figure 8:
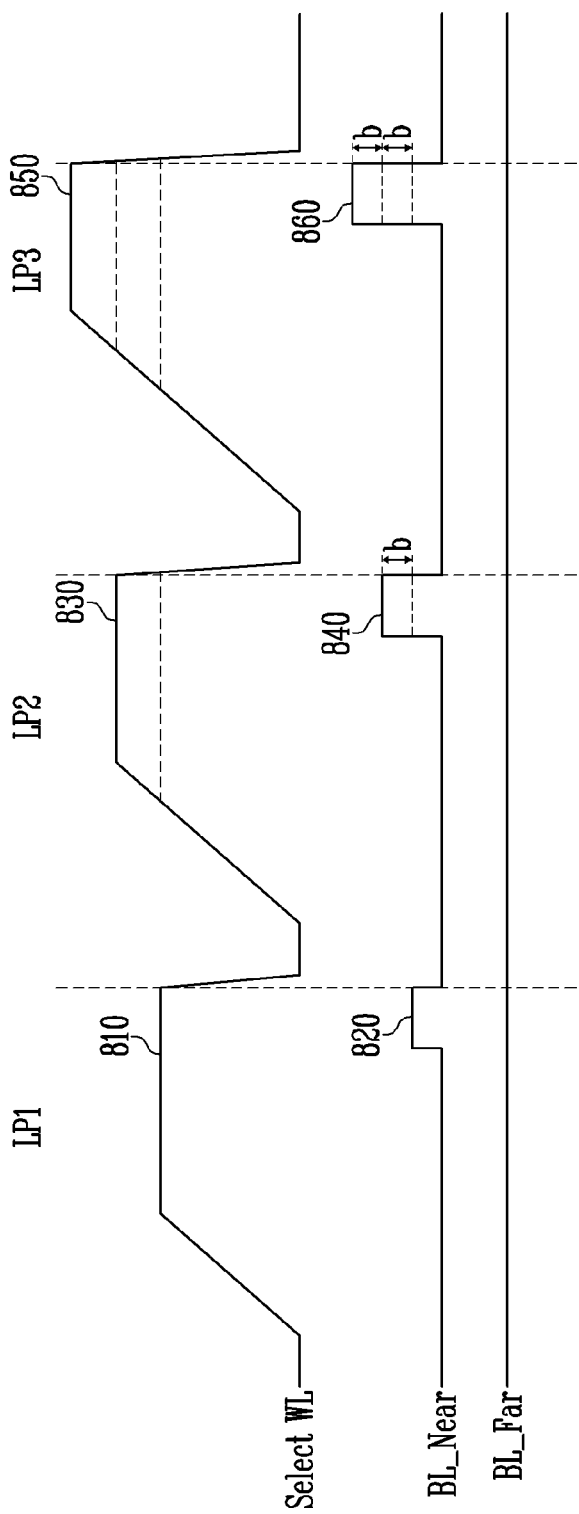
FIG. 8 is a diagram illustrating a method of changing a magnitude of a program permission voltage according to teachings of the present disclosure.

FIG. 8 is a diagram illustrating a method of changing the magnitude of program permission voltages according to an embodiment of the present disclosure.

Referring to FIG. 8, program permission voltages may be applied to a memory cell group which is close to a reference node in response to program voltages applied to the plurality of program loops LP1, PL2, and LP3. The program permission voltages may be applied to the memory cells through bit lines. The magnitude of the program permission voltage may vary depending on the magnitude of the program voltage.

When the first program loop LP1 proceeds, a first program voltage 810 may be applied. When the first program voltage 810 is applied, a first program permission voltage 820 may be applied to a memory cell group which is close to the reference node through the bit lines. The first program permission voltage 820 may be applied earlier by a time determined by the program permission voltage manager from the completion time of the application of the first program voltage 810. The program permission voltage manager may determine the magnitude of the first program permission voltage 820 on the basis of the magnitude of the first program voltage 810. According to an embodiment, the magnitude of the first program permission voltage 820 corresponding to the first program voltage 810 may be determined by a physical distance between the reference node and the memory cell group to which the first program permission voltage 820 is applied, or a physical column address.

When the second program loop LP2 proceeds, a second program voltage 830 may be applied. When the second program voltage 830 is applied, a second program permission voltage 840 may be applied to a memory cell group which is close to the reference node through the bit lines. The program permission voltage manager may determine the magnitude of the second program permission voltage 840 on the basis of the magnitude of the second program voltage 830. The magnitude of the second program permission voltage 840 may be greater than that of the first program permission voltage 820 by 'b'. Because the magnitude of the second program voltage 830 applied in the second program loop LP2 is greater than the first program voltage 810 applied in the first program loop LP1, the second program permission voltage 840 which is greater than the first program permission voltage 820 by 'b' may be applied.

When the third program loop LP3 proceeds, a third program voltage 850 may be applied. When the third program voltage 850 is applied, a third program permission voltage 860 may be applied to a memory cell group which is close to the reference node through the bit lines. The program permission voltage manager may determine the magnitude of the third program permission voltage 860 on the basis of the magnitude of the third program voltage 850. The third program permission voltage 860 may be greater than the second program permission voltage 840 by Because the magnitude of the third program voltage 850 applied in the third program loop LP3 is greater than the second program voltage 830 applied in the second program loop LP2, a third program permission voltage 860 which is greater than the second program permission voltage 840 by 'b' may be applied. The magnitude of the third program permission voltage 860 may be greater than that of the first program permission voltage 820 by '2b'.

According to an embodiment, because the magnitude of the program voltages 810, 830, and 850 increases gradually, the magnitude of the program permission voltages 820, 840, and 860 may be increased gradually by 'b'. When the program permission voltages 820, 840, and 860 are applied, the program speed of the memory cells may be reduced. The difference between the threshold voltages of the memory cells coupled to the same word line may be reduced.

Figure 9:
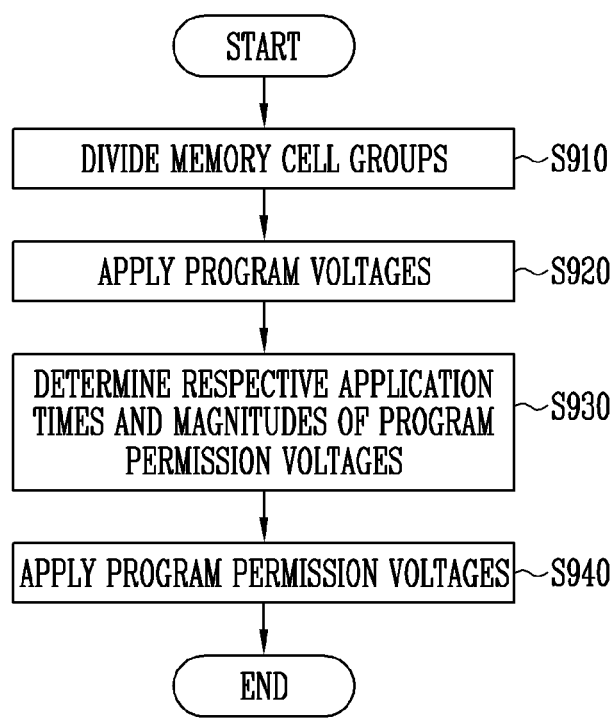
FIG. 9 is a flowchart illustrating a method of performing a program operation in which a program speed is included in a predetermined range according to teachings of the present disclosure.

FIG. 9 is a flowchart illustrating a method of performing a program operation in which a program speed is included in a predetermined range according to an embodiment of the present disclosure.

Referring to FIG. 9, a magnitude of a program permission voltage or a time at which the program permission voltage is applied may vary in response to program voltages which increase gradually. When the program permission voltage is applied to memory cells through a bit line, a program speed of the memory cells may be controlled. By controlling the program speed of the memory cells coupled to the same word line, threshold voltages of memory cells having different physical column addresses with respect to the same program voltage may be controlled to have the same variation.

At step S910, control logic may divide memory cells included in a memory cell array into a plurality of memory cell groups. The total capacity of the memory cells included in each of the plurality of memory cell groups may have a predetermined value. According to an embodiment, a memory cell group may have a capacity of 1 KB to 2 KB. Memory cells included in a memory cell group may have successive physical column addresses.

At step S920, the control logic may apply program voltages, which increase gradually, to the plurality of memory cell groups through word lines. The control logic may perform a program operation. The program operation may include a plurality of program loops. The magnitude of the program voltages may increase in response to the increase in program loops.

At step S930, the program permission voltage manager may determine times at which program permission voltages are applied to the plurality of memory cell groups and magnitudes of the program permission voltages on the basis of the magnitude of the program voltages.

The program permission voltage manager may determine a time at which the first program permission voltage is applied first and a magnitude of the first program permission voltage applied first, based on a first physical distance. The program permission voltage manager may change the application time and the magnitude of the first program permission voltage on the basis of the magnitude of the program voltages.

The program permission voltage manager may determine a program permission voltage to be applied, based on the distance from the reference node to the memory cells included in the first memory cell group. As the distance between the reference node and the memory cells decreases, the magnitude of the program permission voltage may increase.

The program permission voltage manager may determine as the application time of the first program permission voltage, a time which is earlier than a time of completion of applying the program voltages by a time corresponding to the first physical distance. The time at which the first program permission voltage is applied first may be determined by the first physical distance.

According to another embodiment, the program permission voltage manager may determine times at which program permission voltages are applied first and magnitudes of the program permission voltages applied first on the basis of physical column address ranges corresponding to the plurality of memory cells. The program permission voltage manager may change the application times and the magnitudes of the program permission voltages on the basis of the magnitude of the program voltages. The program permission voltage manager may additionally change the application times and the magnitudes of the program permission voltages when the program voltages applied through the word lines are high voltages.

At step S940, the control logic may apply the program permission voltages to the plurality of memory cell groups through bit lines.

The program permission voltage manager ay control the peripheral circuit to apply the first program permission voltage earlier as the magnitude of the program voltages increases. The program permission voltage manager may control the peripheral circuit to advance the application time of the first program permission voltage at a regular interval in response to the gradual increase of the program voltages.

According to an embodiment of the present disclosure, the program permission voltage manager may control the peripheral circuit to increase the magnitude of the first program permission voltage as the magnitude of the program voltages increases. The program permission voltage manager may control the peripheral circuit to increase the magnitude of the first program permission voltage by a regular amount in response to the gradual increase of the program voltages.

According to an embodiment, the control logic may control the peripheral circuit to apply a second program permission voltage to the second memory cell group through bit lines. The program permission voltage manager may control the peripheral circuit such that the first program permission voltage may be applied earlier than the second program permission voltage. According to another embodiment, the program permission voltage manager may control the peripheral circuit so that the first program permission voltage may have a greater magnitude than the second program permission voltage. According to a further embodiment, the program permission voltage manager may control the peripheral circuit so that the first program permission voltage may be both applied earlier than the second program permission voltage and have a greater magnitude than the second program permission voltage.

According to another embodiment of the present disclosure, the program permission voltage manager may determine the application times of the program permission voltages by reflecting an increase in the program voltages from the completion times of the application of the program voltages. The program permission voltage manager may control the peripheral circuit so that each of the program permission voltages may be applied earlier in response to the increase in the program voltages. The program permission voltage manager may control the peripheral circuit to increase each of the program permission voltages in response to the increase in the program voltages.

Figure 10:
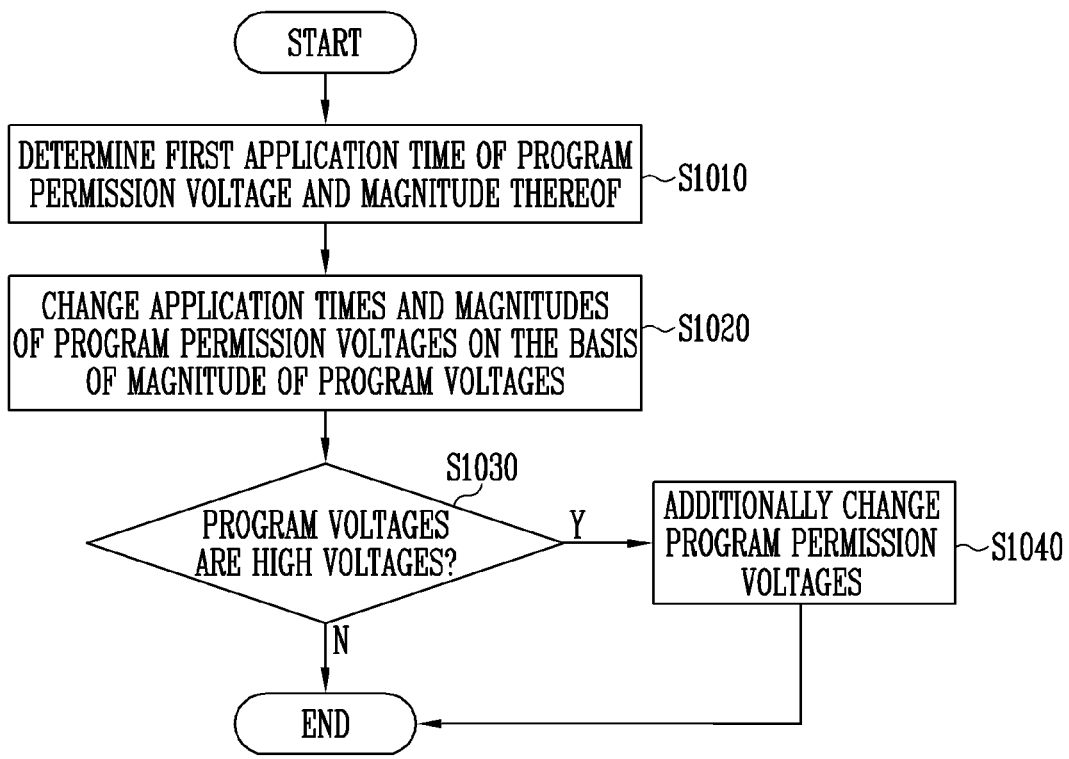
FIG. 10 is a flowchart illustrating a method of determining application times of program permission voltages and magnitudes thereof according to teachings of the present disclosure.

FIG. 10 is a flowchart illustrating a method of determining times at which program permission voltages are applied and magnitudes of the program permission voltages according to an embodiment of the present disclosure.

Referring to FIG. 10, the program permission voltage manager may determine times at which program permission voltages are applied to a plurality of memory cell groups through bit lines and magnitudes of the program permission voltages on the basis of the magnitude of program voltages. The program permission voltage manager may determine a time at which a program permission voltage is applied and a magnitude of the program permission voltage on the basis of a physical column address of a memory cell group to which the program permission voltage is applied. The program permission voltage manager may change the application time of the program permission voltage and the magnitude of thereof on the basis of a magnitude of program voltages which increase gradually. The program permission voltage manager may additionally change the program permission voltage application time and the magnitude thereof depending on whether the program voltages are high voltages or not.

At step S1010, the program permission voltage manager may determine times at which program permission voltages are applied first and magnitudes of the program permission voltages applied first on the basis of physical column address ranges of memory cells included in a plurality of memory cells. Physical column addresses of the memory cells may refer to a physical distance between the memory cell group and the reference node.

Memory cell groups which include memory cells closer to the reference node may have a faster program speed than memory cell groups which include memory cells farther away from the reference node. To match program speeds between memory cells coupled to the same word line, a program permission voltage may be applied to the memory cells with the faster program speed. The program speed of the memory cells to which the program permission voltage is applied may be decreased.

The magnitude of the program permission voltage applied through the bit lines to the memory cell groups may increase toward the reference node. The program permission voltage may be applied earlier through the bit lines as the memory cell groups are closer to the reference node.

At step S1020, the program permission voltage manager may change the times at which the program permission voltages are applied and the magnitudes thereof on the basis of the magnitude of program voltages which increase gradually. As the program loops increase, the magnitude of the program voltages may increase gradually in response to an increase in program loops. As the magnitude of the program voltages increases, the difference in program speed between the memory cells coupled to the same word line may increase.

The program permission voltage manager may advance each of the times at which the program permission voltages are applied on the basis of the magnitude of the program voltages which increase gradually. As the time at which each of the program permission voltages is applied is advanced, the program speed of the memory cells may be reduced. The program speeds reduced by applying the changed program permission voltages may reduce the difference in program speed between the memory cells coupled to the same word line caused by the program voltages which increase gradually.

The program permission voltage manager may increase the respective magnitudes of the program permission voltages on the basis of the magnitude of the program voltages which increase gradually. As the magnitude of each of the program permission voltages is increased, the program speeds of the memory cells may be reduced. The program speeds reduced by applying the changed program permission voltages may reduce the difference in program speed between the memory cells coupled to the same word line caused by the program voltages which increase gradually.

At step S1030, the program permission voltage manager may determine whether the program voltages applied through the word line are high voltages or not. The program voltages may be high voltages or low voltages according to memory cells to which the program voltages are applied. Program voltages corresponding to high voltages may have a greater magnitude than program voltages corresponding to low voltages.

When a program voltage is a low voltage, the program permission voltage manager may determine a program permission voltage without additionally changing a time at which the program permission voltage is applied and a magnitude thereof. On the other hand, when a program voltage is a high voltage, the program permission voltage manager may further proceed to step S1040.

At step S1040, the program permission voltage manager may additionally change the program permission voltage application time and the magnitude thereof. The program permission voltage manager may advance the time at which the program permission voltage is applied when the program voltage is the high voltage. The program permission voltage manager may increase the magnitude of the program permission voltage in response to the program voltage corresponding to the high voltage.

When a program voltage corresponding to a high voltage which is increased from a program voltage corresponding to a low voltage is applied as a program voltage, the difference in program speed between memory cells coupled to the same word line may be further increased. The program permission voltage manager may reduce the difference in program speed between the memory cells by additionally changing the time at which the program permission voltage is applied to the memory cells through the bit lines and the magnitude of the program permission voltage.

According to an embodiment of the present disclosure, at least one of a time at which a program permission voltage is applied and a magnitude of the program permission voltage may be changed in response to an increase of a program voltage. In other words, when the magnitude of the program voltage increases, the time at which the program permission voltage is applied may be advanced, or the magnitude of the program permission voltage may be increased. In addition, when the magnitude of the program voltage increases, the application time of the program permission voltage may be advanced, and the magnitude of the program permission voltage may be increased.

Figure 11:
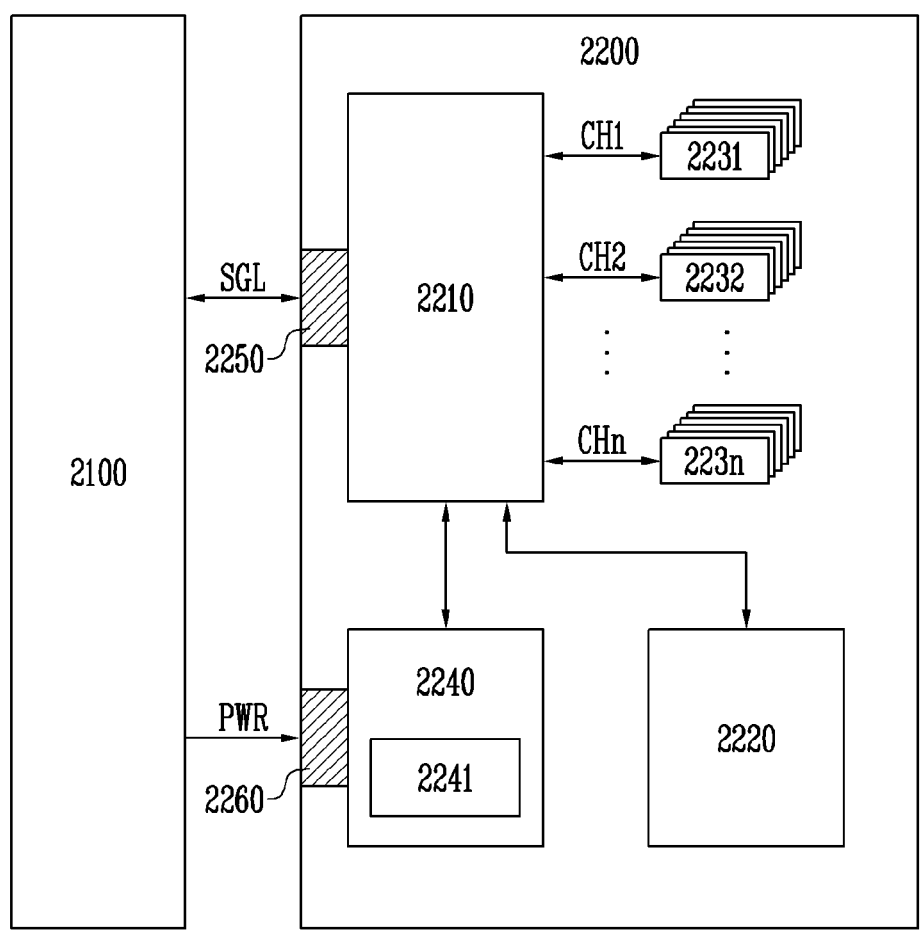
FIG. 11 is a diagram illustrating an example of a data processing system including a solid state drive according to an embodiment of the present disclosure.

FIG. 11 is a diagram illustrating a data processing system 2000 including a solid-state drive (SSD) 2200 according to an embodiment of the present disclosure, Referring to FIG. 11, the data processing system 2000 may include a host device 2100 and the SSD 2200.

The SSD 2200 may include a controller 2210, a buffer memory device 2220, nonvolatile memories 2231 to 223n, a power supply 2240, a signal connector 2250, and a power connector 2260.

The controller 2210 may perform general operations of the SSD 2200. According to an embodiment of the present disclosure, the controller 2210 may control program operations performed by the plurality of nonvolatile memories 2231 to 223n. The controller 2210 may control a program speed of each of the nonvolatile memories 2231 to 223n. The controller 2210 may control program speeds for the program operations to vary according to a physical distance of the nonvolatile memories 2231 to 223n.

According to an embodiment of the present disclosure, the controller 2210 may increase the magnitude of program voltages applied to the nonvolatile memories 2231 to 223n as program loops increase. When the magnitude of the program voltages increases, a difference in program speed between the nonvolatile memories 2231 to 223n may increase according to the physical distance of the nonvolatile memories 2231 to 223n. The controller 2210 may maintain a constant difference in program speed between the nonvolatile memories 2231 to 223n despite the increase in program speeds by applying the program permission voltage in response to the increase in magnitude of the program voltages.

The buffer memory device 2220 may temporarily store data to be stored in the plurality of nonvolatile memories 2231 to 223n. In addition, the buffer memory device 2220 may temporarily store data read from the nonvolatile memories 2231 to 223n. The data temporarily stored in the buffer memory device 2220 may be transferred to the host device 2100 or the nonvolatile memories 2231 to 223n in response to the control of the controller 2210.

The nonvolatile memories 2231 to 223n may serve as storage media of the SSD 2200. Each of the nonvolatile memories 2231 to 223n may be coupled to the controller 2210 through a plurality of channels CH1 to CHn. One or more nonvolatile memories may be coupled to one channel, Nonvolatile memories coupled to one channel may be coupled to the same signal bus or data bus.

The power supply 2240 may supply power PWR which is input through the power connector 2260 to the inside of the SSD 2200, The power supply 2240 may include an auxiliary power supply 2241. The auxiliary power supply 2241 may supply power such that the SSD 2200 may be terminated normally when a sudden power off occurs. The auxiliary power supply 2241 may include large-capacity capacitors which charge the power PWR.

The controller 2210 may exchange signals SGL with the host device 2100 through the signal connector 2250. The signals SGL may include commands, addresses, and data. The signal connector 2250 may be configured as various types of connectors according to an interfacing method of the host device 2100 and the SSD 2200.

Figure 12:
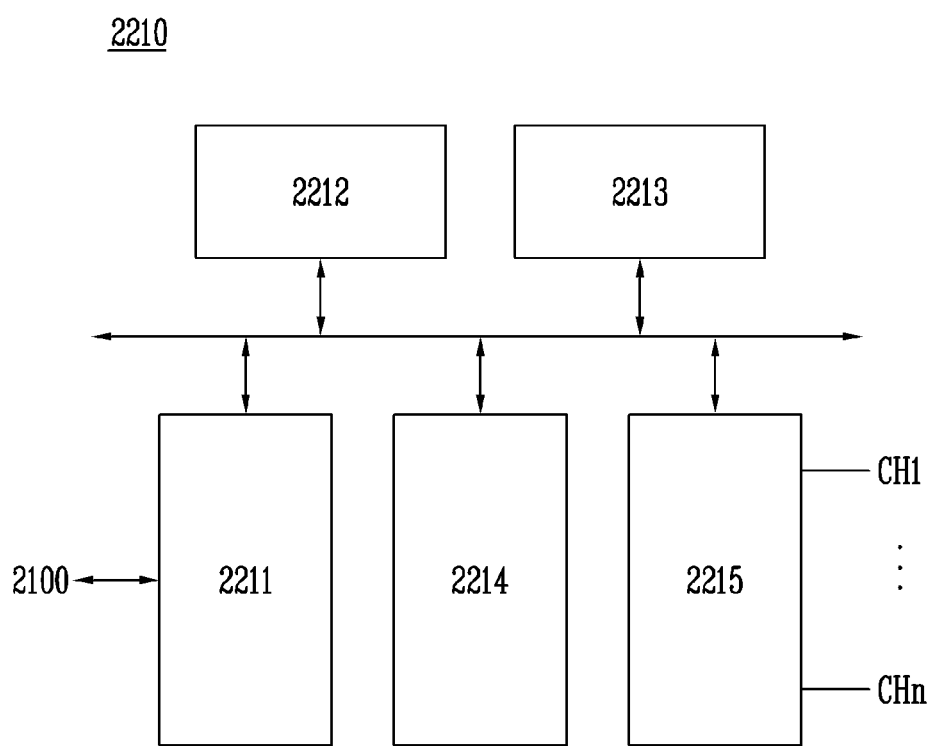
FIG. 12 is a diagram illustrating an example of the configuration of a controller of FIG. 11.

FIG. 12 is a diagram illustrating the controller 2210 of FIG. 11 according to an embodiment of the present disclosure. Referring to FIG. 12, the controller 2210 may include a host interface unit 2211, a control unit 2212, random access memory 2213, an error correction code (ECC) unit 2214, and a memory interface unit 2215.

The host interface unit 2211 may interface with the host device 2100 and the SSD 2200 according to a protocol of the host device 2100. For example, the host interface unit 2211 may communicate with the host device 2100 through one of the protocols such as a secure digital (SD) card, a universal storage bus (USB) storage device, a multimedia card (MMC), an embedded MMC (eMMC), an personal computer memory card international association (PCMCIA), a parallel advanced technology attachment (PATA), a serial advanced technology attachment (SATA), a small computer system interface (SCSI), a serial-attached SCSI (SAS), peripheral component interconnect (PCI), peripheral component interconnect express (PCI-E), and a universal flash storage (UFS) device. In addition, the host interface unit 2211 may perform a disk emulation function which allows the host device 2100 to recognize the SSD 2200 as a universal data storage device, for example, a hard disk drive (HDD).

The control unit 2212 may analyze and process the signal SGL which is input from the host device 2100. The control unit 2212 may control operations of internal function blocks according to firmware or software for driving the SSD 2200. The random access memory 2213 may serve as an operating memory for driving the firmware or the software.

According to an embodiment of the present disclosure, the control unit 2212 may control the program operations performed by the nonvolatile memories 2231 to 223n. The control unit 2212 may apply a program permission voltage to the memory cells so that a difference between effective application times of the program voltages applied to the memory cells included in the nonvolatile memories 2231 to 223n may be less than a predetermined value.

The ECC unit 2214 may generate parity data of data to be transferred to the nonvolatile memories 2231 to 223n. The generated parity data may be stored together with the data in the nonvolatile memories 2231 to 223n, The ECC unit 2214 may detect errors in the data which is read from the nonvolatile memories 2231 to 223n. The ECC unit 2214 may correct the detected errors in a correctable range.

The memory interface unit 2215 may provide the nonvolatile memories 2231 to 223n with a control signal such as a command and an address in response to the control of the control unit 2212. The memory interface unit 2215 may exchange data with the nonvolatile memories 2231 to 223n in response to the control of the control unit 2212, For example, the memory interface unit 2215 may provide the data stored in the buffer memory device 2220 to the nonvolatile memories 2231 to 223n, or may provide the data read from the nonvolatile memories 2231 to 223n to the buffer memory device 2220.

Figure 13:
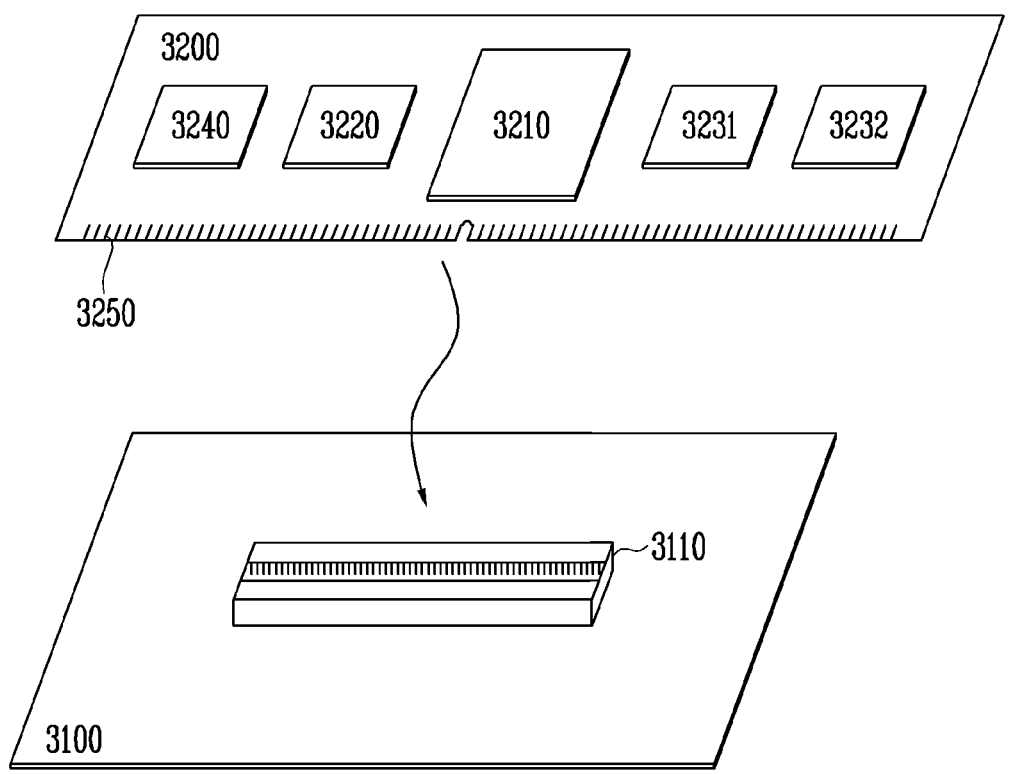
FIG. 13 is a diagram illustrating an example of a data processing system including a data storage device according to an embodiment of the present disclosure.

FIG. 13 is a diagram illustrating an example of a data processing system 3000 including a data storage device according to an embodiment of the present disclosure. Referring to FIG. 13, the data processing system 3000 may include a host device 3100 and a data storage device 3200.

The host device 3100 may be configured as a board such as a printed circuit board. Though not shown in FIG. 13, the host device 3100 may include internal function blocks for functioning as the host device 3100.

The host device 3100 may include a connection terminal 3110 such as a socket, a slot, or a connector. The data storage device 3200 may be mounted onto the connection terminal 3110.

The data storage device 3200 may be configured as a board such a printed circuit board. The data storage device 3200 may be referred to as a memory module or a memory card. The data storage device 3200 may include a controller 3210, a buffer memory device 3220, nonvolatile memories 3231 and 3232, a power management integrated circuit (PMIC) 3240, and a connection terminal 3250.

The controller 3210 may control the general operations of the data storage device 3200, The controller 3210 may be configured in the same manner as the controller 2210 as shown in FIG. 11. In the same manner, according to an embodiment of the present disclosure, the controller 3210 may maintain a constant program speed difference between the nonvolatile memories 3231 and 3232 despite an increase in program loops by applying a program permission voltage in response to an increase in magnitude of the program voltages.

The buffer memory device 3220 may temporarily store data which is to be stored in the nonvolatile memories 3231 and 3232. In addition, the buffer memory device 3220 may temporarily store data which is read from the nonvolatile memories 3231 and 3232. The data which is temporarily stored in the buffer memory device 3220 may be transferred to the host device 3100 or the nonvolatile memories 3231 and 3232 in response to the control of the controller 3210.

The nonvolatile memories 3231 and 3232 may serve as storage media of the data storage device 3200.

The PMIC 3240 may provide power, which is input through the connection terminal 3250, in the data storage device 3200, The PMIC 3240 may manage the power of the data storage device 3200 in response to the control of the controller 3210.

The connection terminal 3250 may be coupled to the connection terminal 3110 of the host device 3100, Through the connection terminal 3250, power and signals such as commands, addresses, and data may be transferred between the host device 3100 and the data storage device 3200. The connection terminal 3250 may have various configurations depending on an interfacing method of the host device 3100 and the data storage device 3200. The connection terminal 3250 may be arranged on one side of the data storage device 3200.

Figure 14:
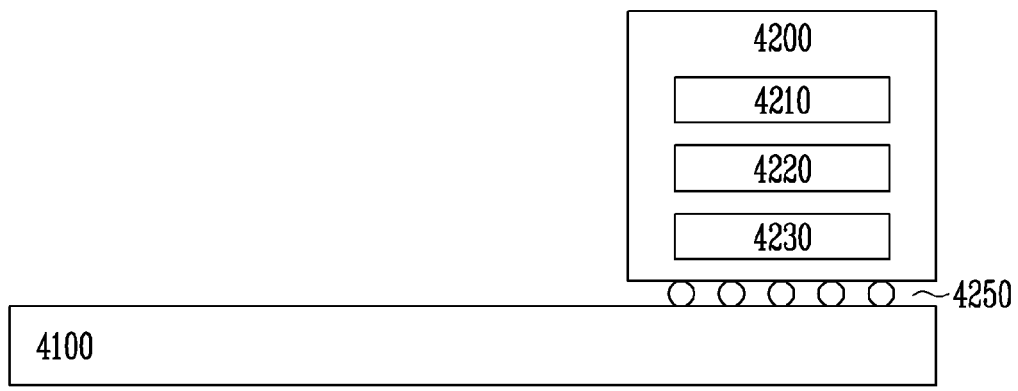
FIG. 14 is a diagram illustrating an example of a data processing system including a data storage device according to an embodiment of the present disclosure.

FIG. 14 is a diagram illustrating an example of a data processing system 4000 including a data storage device according to an embodiment of the present disclosure. Referring to FIG. 14, the data processing system 4000 may include a host device 4100 and a data storage device 4200.

The host device 4100 may be configured as a board such as a printed circuit board. Though not shown in FIG. 14, the host device 4100 may include internal function blocks for performing functions of the host device 4100.

The data storage device 4200 may be configured as a surface mount package type. The data storage device 4200 may be mounted onto the host device 4100 through a solder ball 4250. The data storage device 4200 may include a controller 4210, a buffer memory device 4220, and a nonvolatile memory 4230.

The controller 4210 may control the general operations of the data storage device 4200, The controller 4210 may be configured in the same manner as the controller 2210 as shown in FIG. 11. In the same manner, according to an embodiment of the present disclosure, the controller 4210 may control a program speed of memory cells included in the nonvolatile memory 4230 by applying a program permission voltage. The controller 4210 may maintain a program speed difference between the memory cells of the nonvolatile memory 4230 at a predetermined value or less even when the magnitude of the program voltages increases.

The buffer memory device 4220 may temporarily store data which is to be stored in the nonvolatile memory 4230. In addition, the buffer memory device 4220 may temporarily store data read from the nonvolatile memory 4230. The data which is temporarily stored in the buffer memory device 4220 may be transferred to the host device 4100 or the nonvolatile memory 4230 in response to the control of the controller 4210.

The nonvolatile memory 4230 may serve as a storage medium of the data storage device 4200.

Figure 15:
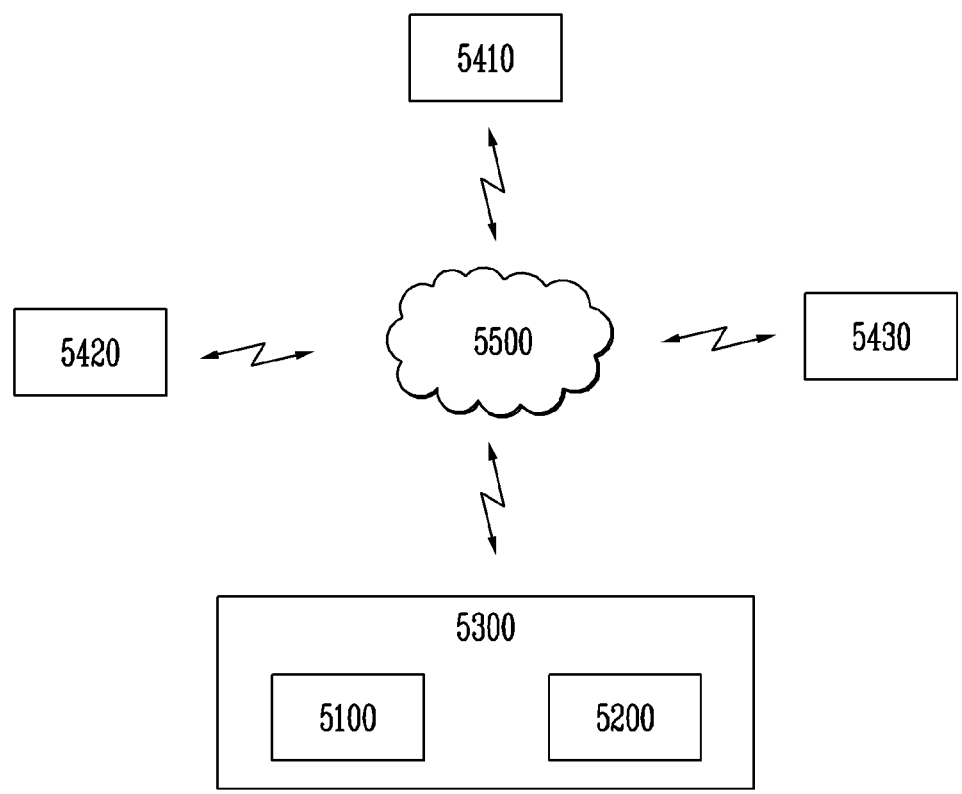
FIG. 15 is a diagram illustrating an example of a network system including a data storage device according to an embodiment of the present disclosure.

FIG. 15 is a diagram illustrating an example of a network system 5000 including a data storage device. Referring to FIG. 15, the network system 5000 may include a server system 5300 and a plurality of client systems 5410 to 5430 through a network 5500.

The server system 5300 may provide data services in response to a request from the plurality of client systems 5410 to 5430, For example, the server system 5300 may store data provided from the plurality of client systems 5410 to 5430. In another example, the server system 5300 may provide data to the plurality of client systems 5410 to 5430.

The server system 5300 may include a host device 5100 and a data storage device 5200. The data storage device 5200 may be configured using the memory device 100 of FIG. the SSD 2200 of FIG. 11, the data storage device 3200 of FIG. 13, and the data storage device 4200 of FIG. 14.

The data storage device 5200 may include a controller that controls general operations of the data storage device 5200. According to an embodiment, the controller may control a program speed of each of the memory cells included in the data storage device 5200 by applying a program permission voltage to the memory cells. The controller may maintain a program speed difference between the memory cells at a predetermined value or less by advancing a time at which the program permission voltage is applied, or by increasing the magnitude of the program permission voltage as the magnitude of the program voltage applied to the memory cells increases.

According to the present disclosure, a memory device capable of maintaining constant program speeds of memory cells coupled to the same word line regardless of physical column addresses of the memory cells, and a program speed control method thereof may be provided.

It will be apparent to those skilled in the art that various modifications can be made to the above-described embodiments of the present teachings without departing from the spirit or scope of the present teachings, Thus, it is intended that the present teachings cover all such modifications provided they come within the scope of the appended claims and their equivalents.

What is claimed is:

1. A memory device, comprising:
a memory cell array including a first memory cell group including memory cells located within a first physical distance from a reference node and a second memory cell group including memory cells located beyond the first physical distance from the reference node;
a peripheral circuit configured to perform a program operation of applying program voltages increasing gradually to memory cells included in the memory cell array through word lines; and
control logic configured to determine a time at which a first program permission voltage is applied to the first memory cell group and determine a magnitude of the first program permission voltage on the basis of a magnitude of the program voltages in response to an increase in the program voltages, the control logic is further configured to control the peripheral circuit to apply the first program permission voltage to the first memory cell group through bit lines.

2. The memory device of claim 1, wherein the control logic includes a program permission voltage manager configured to determine a time at which the first program permission voltage is applied first and a magnitude of the first program permission voltage applied first on the basis of the first physical distance, and configured to change the time at which the first program permission voltage is applied and the magnitude of the first program permission voltage on the basis of the magnitude of the program voltages.

3. The memory device of claim 2, wherein the time at which the first program permission voltage is applied is earlier than application completion times of the program voltages by a time determined by the program permission voltage manager.

4. The memory device of claim 3, wherein the program permission voltage manager is configured to control the peripheral circuit to apply the first program permission voltage earlier as the magnitude of the program voltages increases.

5. The memory device of claim 4, wherein the program permission voltage manager is configured to control the peripheral circuit to advance the time at which the first program permission voltage is applied at a regular interval in response to the gradual increase of the program voltages.

6. The memory device of claim 4, wherein the program permission voltage manager is configured to control the peripheral circuit to increase the magnitude of the first program permission voltage as the magnitude of the program voltages increases.

7. The memory device of claim 6, wherein the program permission voltage manager is configured to control the peripheral circuit to increase the magnitude of the first program permission voltage by a regular amount in response to the gradual increase of the program voltages.

8. The memory device of claim 2, wherein the control logic is configured to control the peripheral circuit such that a difference in effective application time of a program voltage applied to memory cells coupled to a same word line, among the memory cells included in the first memory cell group and the second memory cell group, is less than a predetermined reference value, and
wherein the effective application time of the program voltage is determined by a program voltage applied through the word lines and a program permission voltage applied through the bit lines.

9. The memory device of claim 2, wherein the control logic controls the peripheral circuit to apply the second program permission voltage to the second memory cell group through the bit lines, and
wherein the program permission voltage manager controls the peripheral circuit such that the first program permission voltage is applied earlier than the second program permission voltage.

10. The memory device of claim 2, wherein the control logic controls the peripheral circuit to apply the second program permission voltage to the second memory cell group through the bit lines, and
wherein the program permission voltage manager controls the peripheral circuit such that the magnitude of the first program permission voltage is greater than a magnitude of the second program permission voltage.

11. The memory device of claim 2, wherein the program voltages are high voltages or low voltages depending on the memory cells to which the program voltages are applied, and
wherein the program permission voltage manager additionally changes the time at which the first program permission voltage is applied, or the magnitude of the first program permission voltage in response to the program voltages applied through the word lines when the program voltages are the high voltages.

12. A memory device, comprising:
a memory cell array including a plurality of memory cell groups, each of the plurality of memory cell groups including a plurality of memory cells having physical column addresses included in a predetermined range;
a peripheral circuit configured to perform a program operation of applying program voltages increasing gradually to the plurality of memory cells included in the memory cell array through word lines; and
control logic configured to determine times at which program permission voltages are applied to the plurality of memory cell groups, respectively, and magnitudes of the program permission voltages on the basis of a magnitude of the program voltages in response to an increase in the program voltages, the control logic is further configured to control the peripheral circuit to apply the program permission voltages through bit lines.

13. The memory device of claim 12, wherein the control logic is configured to determine times at which the program permission voltages are applied first and magnitudes of the program permission voltages applied first on the basis of the physical column addresses corresponding to the plurality of memory cells, respectively, and is further configured to change the times at which the program permission voltages are applied and the magnitudes of the program permission voltages on the basis of magnitudes of the program voltages.

14. The memory device of claim 12, wherein the program voltages are high voltages or low voltages depending on the memory cells to which the program voltages are applied, and
wherein a program permission voltage manager included in the control logic is configured to change the times at which the program permission voltages are applied and the magnitudes of the program permission voltages in response to the program voltages applied through the word lines when the program voltages are the high voltages.

15. The memory device of claim 14, wherein the times at which the program permission voltages are applied are earlier than application completion times of the program voltages by a time determined by the program permission voltage manager.

16. The memory device of claim 15, wherein the program permission voltage manager is configured to control the peripheral circuit to apply the program permission voltages earlier in response to an increase of the program voltages.

17. The memory device of claim 16, wherein the program permission voltage manager is configured to control the peripheral circuit to increase the magnitudes of the program permission voltages in response to the increase of the program voltages.

18. A method of operating a memory device, the method comprising:
  designating a plurality of memory cell groups including a predetermined number of memory cells having successive physical column addresses;
  applying program voltages increasing gradually to the plurality of memory cell groups through word lines;
  determining application times of program permission voltages applied to the plurality of memory cell groups, respectively, and magnitudes of the program permission voltages on the basis of a magnitude of the program voltages; and
  applying the program permission voltages to the plurality of memory cell groups through bit lines.

19. The method of claim 18, wherein determining the application times of the program permission voltages applied to the plurality of memory cell groups, respectively, and the magnitudes of the program permission voltages comprises:
  determining times at which the program permission voltages are applied first and magnitudes of the program permission voltages applied first on the basis of physical column address ranges of the memory cells included in the plurality of memory cells groups; and
  changing the application times and the magnitudes of the program permission voltages on the basis of the magnitude of the program voltages increasing gradually.

20. The method of claim 19, wherein the program voltages are high voltages or low voltages depending on the memory cells to which the program voltages are applied, and
  wherein determining the application times of the program permission voltages and the magnitudes of the program permission voltages further comprises additionally changing the application times of the program permission voltages and the magnitudes of the program permission voltages in response to the program voltages applied through the word lines when the program voltages are the high voltages.

21. The method of claim 20, wherein the application times of the program permission voltages are earlier than application completion times of the program voltages by a time determined by the program permission voltage manager.

22. The method of claim 21, wherein applying the program permission voltages comprises applying the program permission voltages earlier in response to a gradual increase in the program voltages.

23. The method of claim 22, wherein applying the program permission voltages comprises applying the program permission voltages increased in magnitude in response to the gradual increase in the program voltages.

* * * * *